United States Patent
Wang et al.

(10) Patent No.: US 11,644,934 B2
(45) Date of Patent: May 9, 2023

(54) TOUCH ELECTRODE LAYER AND TOUCH DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Jieping Wang, Wuhan (CN); Jian Ye, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 286 days.

(21) Appl. No.: 17/267,494

(22) PCT Filed: Jul. 22, 2020

(86) PCT No.: PCT/CN2020/103400
§ 371 (c)(1),
(2) Date: Feb. 9, 2021

(87) PCT Pub. No.: WO2022/000618
PCT Pub. Date: Jan. 6, 2022

(65) Prior Publication Data
US 2022/0300113 A1    Sep. 22, 2022

(30) Foreign Application Priority Data

Jun. 28, 2020 (CN) .................. 202010597716.X

(51) Int. Cl.
G06F 3/044 (2006.01)
G06F 3/041 (2006.01)
H01L 27/32 (2006.01)

(52) U.S. Cl.
CPC .......... *G06F 3/0446* (2019.05); *G06F 3/0412* (2013.01); *H01L 27/323* (2013.01); *G06F 2203/04112* (2013.01); *H01L 27/3244* (2013.01)

(58) Field of Classification Search
None
See application file for complete search history.

(56) References Cited

FOREIGN PATENT DOCUMENTS

| CN | 104182081 A | 12/2014 |
|---|---|---|
| CN | 108415629 A | 8/2018 |

(Continued)

OTHER PUBLICATIONS

International Search Report in International application No. PCT/CN2020/103400, dated Mar. 15, 2021.

(Continued)

*Primary Examiner* — Nicholas J Lee
(74) *Attorney, Agent, or Firm* — PV IP PC; Wei Te Chung; Ude Lu

(57) ABSTRACT

A touch electrode layer and a touch display device are provided. The touch electrode layer includes a plurality of touch electrode units. The touch electrode unit includes a first electrode and a second electrode. The first electrode includes a first electrode branch having a first branch widening part. The second electrode includes a second electrode branch having a second branch widening part. The first electrode branch and the second electrode branch are disposed alternately, and a dummy electrode is disposed within the first electrode and the second electrode.

19 Claims, 5 Drawing Sheets

(56) References Cited

FOREIGN PATENT DOCUMENTS

| | | |
|---|---|---|
| CN | 109375840 A | 2/2019 |
| CN | 110737360 A | 1/2020 |
| CN | 110764660 A | 2/2020 |

OTHER PUBLICATIONS

Written Opinion of the International Search Authority in International application No. PCT/CN2020/103400, dated Mar. 15, 2021.

TOUCH ELECTRODE LAYER AND TOUCH DISPLAY DEVICE

RELATED APPLICATIONS

This application is a Notional Phase of PCT Patent Application No. PCT/CN2020/103400 having international filing date of Jul. 22, 2020, which claims the benefit of priority of Chinese Patent Application Nos. 202010597716.X filed on Jun. 28, 2020. The contents of the above applications are all incorporated by reference as if fully set forth herein in their entirety.

BACKGROUND OF INVENTION

Field of Invention

The present invention relates to the field of touch display technology, and more particularly, to a touch electrode layer and a touch display device.

Description of Prior Art

Capacitive touch displays are widely used in different electronic interactive scene devices due to their high durability, long life span, and support for multi-touch functions. The capacitive touch displays detect a specific position by identifying a capacitance change at a position where a finger touches a display. Therefore, when the capacitance change is small when touched, the traditional capacitive touch displays may be unable to accurately detect the conductive touch by the finger.

A structural design of the touch displays is a very important factor for detecting the change in capacitance, so it is necessary to develop a touch display that may detect a small change in capacitance. Currently, patterned touch sensing electrodes of flexible active-matrix organic light emitting diode (AMOLED) display panels have to be directly fabricated on an upper surface of the packaging layer. However, a thickness of packaging layer is relatively thin, which is usually less than 10 μm, so a distance between the touch electrode and the cathode is less, resulting a larger parasitic capacitance between driving electrodes (Tx) and sensing electrodes (Rx), causing a longer delay in resistive-capacitance (RC) delay, and leading to lower touch sensitivity. Currently, the touch electrodes of flexible AMOLED display panels are usually made of a hollowed metal mesh and their conductive area are lesser as compared to the effective conductivity of the traditional touch electrodes made of transparent indium tin oxide (ITO). Therefore, the mutual capacitance between the Tx and Rx is very small, and resulting a small capacitance change when touched by a finger, which may not be easily detected by a touch integrated circuit (IC).

Therefore, it is necessary to provide a new touch electrode layer and a touch display device, which may improve resolution and accuracy of the touch position detection of the touch display devices.

SUMMARY OF INVENTION

A touch electrode layer and a touch display device which may detect small capacitance change and improved resolution and accuracy for detecting the touch position are provided.

A method of manufacturing a touch electrode layer is provided, and the touch electrode layer comprises a plurality of touch electrode units disposed in an array and electrically connected to each other, and the touch electrode unit comprises a first electrode disposed along a first direction, and the first electrode comprises a first electrode trunk and a plurality of first electrode branches, and the plurality of first electrode branches are electrically connected to the first electrode trunk, and each of the first electrode branches comprises at least a first branch widening part and a first branch connecting part connected to the first widening part, and a width of the first branch widening part is greater than a width of the first branch connecting part; and a second electrode disposed along a first direction, and the second electrode comprises a second electrode trunk and a plurality of second electrode branches, and the plurality of second electrode branches are electrically connected to the second electrode trunk, and each of the second electrode branches comprises at least a second branch widening part and a second branch connecting part connected to the second widening part, and a width of the second branch widening part is greater than a width of the second branch connecting part, and the first direction is different from the second direction; and a second hollow area is formed in the at least a second branch widening part of the second electrode, and a second dummy electrode is disposed in the second hollow area; and the first dummy electrode, the second dummy electrode, the first electrode, and the second electrode are electrically insulated from each other.

In one embodiment, in the touch electrode layer, a third dummy electrode is disposed on a junction between edges of the first electrode and the second electrode, and the third dummy electrode, the first electrode, and the second electrode are electrically insulated from each other.

In one embodiment, in the touch electrode layer, each the first branch widening part of the first electrode branch is disposed correspondingly to the second branch connecting part of the second electrode branch adjacent to the first electrode branch; and each the first branch connecting part of the first electrode branch is disposed correspondingly to the second widening part of the second electrode branch adjacent to the first electrode branch.

In one embodiment, in the touch electrode layer, the first electrode trunk comprises a first electrode longitudinal trunk extending along the first direction and two first electrode transverse trunks located at both ends of the first electrode longitudinal trunk and extending along the second direction, and the first electrode longitudinal trunk and the first electrode transverse trunk are electrically connected to the first electrode branch; and the second electrode trunk comprises a second electrode transverse trunk extending along the second direction and two second electrode longitudinal trunks located at both ends of the second electrode transverse trunk extending along the first direction, and the second electrode longitudinal trunk and the second electrode transverse trunk are electrically connected to the second electrode branch.

In one embodiment, in the touch electrode layer, the first electrode branch from the first electrode trunk extends away from an intersection point of the first electrode longitudinal trunk and the first electrode transverse trunk, and an angle α between the first electrode branch and the first electrode longitudinal trunk satisfies $0°<α<90°$; and the second electrode branch from the second electrode trunk extends away from an intersection point of the second electrode longitudinal trunk and the second electrode transverse trunk, and an angle β between the second electrode branch and the second electrode longitudinal trunk satisfies $0°<β<90°$.

In one embodiment, in the touch electrode layer, the first electrode branch and the second electrode branch adjacent to the first electrode branch are parallel to each other.

In one embodiment, in the touch electrode layer, the first direction is perpendicular to the second direction.

In one embodiment, in the touch electrode layer, the angle α between the first electrode branch and the first electrode longitudinal trunk is 45°, and the angle β between the second electrode branch and the second electrode transverse trunk is 45°.

In one embodiment, in the touch electrode layer, the first electrode and the second electrode are mirror-symmetric with respect to the first electrode longitudinal trunk and the second electrode transverse trunk.

In one embodiment, in the touch electrode layer, two first electrode longitudinal trunks located on both sides of the second electrode transverse trunk are connected by a first connecting part; and two second electrode transverse trunks located on both sides of the first electrode longitudinal trunk are connected by a second connecting part; and the first connecting part is made of two connecting bridges are not connected to each other, and the first connecting part and the second connecting part are insulated from each other.

A method of manufacturing a touch display device is provided, and the touch display device comprises a touch electrode layer and an organic light emitting diode display panel, and the touch electrode layer is disposed on the organic light emitting diode display panel comprising an organic light emitting diode array layer and a thin film packaging layer, and the thin film packaging layer is disposed between the organic light emitting diode array layer and the touch electrode layer; and the touch electrode layer comprises a plurality of touch electrode units disposed in an array and electrically connected to each other, and each of the touch electrode units comprises:

a first electrode disposed along a first direction, and the first electrode comprises a first electrode trunk and a plurality of first electrode branches, and the plurality of first electrode branches are electrically connected to the first electrode trunk, and each of the first electrode branches comprises at least a first branch widening part and a first branch connecting part connected to the first widening part, and a width of the first branch widening part is greater than a width of the first branch connecting part; and a second electrode disposed along a first direction, and the second electrode comprises a second electrode trunk and a plurality of second electrode branches, and the plurality of second electrode branches are electrically connected to the second electrode trunk, and each of the second electrode branches comprises at least a second branch widening part and a second branch connecting part connected to the second widening part, and a width of the second branch widening part is greater than a width of the second branch connecting part, and the first direction is different from the second direction; and each of the first electrode branch and the second electrode branch are disposed alternately, and a first hollow area is formed in the at least a first branch widening part of the first electrode, and a first dummy electrode is disposed in the first hollow area; and a second hollow area is formed in the at least a second branch widening part of the second electrode, and a second dummy electrode is disposed in the second hollow area; and in the first dummy electrode, the second dummy electrode, the first electrode, and the second electrode are electrically insulated from each other.

In one embodiment, in the touch display device, a third dummy electrode is disposed on a junction between edges of the first electrode and the second electrode, and the third dummy electrode, the first electrode, and the second electrode are electrically insulated from each other.

In one embodiment, in the touch display device, each the first branch connecting part of the first electrode branch is disposed corresponding to the second widening part of the second electrode branch adjacent to the first electrode branch.

In one embodiment, in the touch display device, the first electrode trunk comprises a first electrode longitudinal trunk extending along the first direction and two first electrode transverse trunks located at both ends of the first electrode longitudinal trunk and extending along the second direction, and the first electrode longitudinal trunk and the first electrode transverse trunk are electrically connected to the first electrode branch; and the second electrode trunk comprises a second electrode transverse trunk extending along the second direction and two second electrode longitudinal trunks located at both ends of the second electrode transverse trunk extending along the first direction, and the second electrode longitudinal trunk and the second electrode transverse trunk are electrically connected to the second electrode branch.

In one embodiment, in the touch display device, the first electrode branch from the first electrode trunk extends away from an intersection point of the first electrode longitudinal trunk and the first electrode transverse trunk, and an angle α between the first electrode branch and the first electrode longitudinal trunk satisfies 0°<α<90°; and the second electrode branch from the second electrode trunk extends away from an intersection point of the second electrode longitudinal trunk and the second electrode transverse trunk, and an angle β between the second electrode branch and the second electrode longitudinal trunk satisfies 0°<β<90°.

In one embodiment, in the touch display device, the first electrode branch and the second electrode branch adjacent to the first electrode branch are parallel to each other.

In one embodiment, in the touch display device, the first direction is perpendicular to the second direction.

In one embodiment, in the touch electrode layer, the angle α between the first electrode branch and the first electrode longitudinal trunk is 45°, and the angle β between the second electrode branch and the second electrode transverse trunk is 45°.

In one embodiment, in the touch display device, the first electrode and the second electrode are mirror-symmetric with respect to the first electrode longitudinal trunk and the second electrode transverse trunk.

In one embodiment, in the touch display device, two first electrode longitudinal trunks located on both sides of the second electrode transverse trunk are connected by a first connecting part; and two second electrode transverse trunks located on both sides of the first electrode longitudinal trunk are connected by a second connecting part; and the first connecting part is made of two connecting bridges that are not connected to each other.

In one embodiment, in the touch display device, the organic light emitting diode array layer comprises a plurality of sub-pixels, and the first electrode branch and the second electrode branch are made of the metal mesh; and an orthographic projection of the first electrode branch on the organic light emitting diode array layer is surrounded by at least two sub-pixels in a width direction of the first electrode branch; and an orthographic projection of the second electrode branch on the organic light emitting diode array layer is surrounded by at least two sub-pixels in a width direction of the second electrode branch.

As compared to the prior art, the touch electrode of the present invention is formed by disposing the first electrode branch and the second electrode branch alternately. The first electrode branch widening part formed by the first electrode branch and the second branch widening part formed by the second electrode are correspondingly misaligned, which increases a length of a junction between the first electrode branch and the second electrode branch, and may effectively increase the mutual inductive capacitance between the touch driving electrode and the touch sensing electrode. At the same time, the mutual capacitance electric field distribution in the entire touch display device is distributed more evenly, which helps to improve the resolution and accuracy of detecting the touch position. By disposing dummy electrodes between and within the driving electrode and the sensing electrode, the parasitic capacitance of the electrode to the cathode is effectively reduced, thereby improving the reporting rate, and the dummy electrode disposed between the driving electrode and the sensing electrode may also increase the ratio of mutual capacitance change when the finger is touched and not touched, thereby improving the signal-to-noise ratio.

DETAILED DESCRIPTION OF PREFERRED EMBODIMENTS

In order to make the purpose, technical solution, and effect of the present invention clearer and more definite, the present invention is further described in detail below with reference to the accompanying drawings and examples. It should be understood that the specific embodiments described herein are only used to explain the present invention, and are not used to limit herein.

Figure 1:
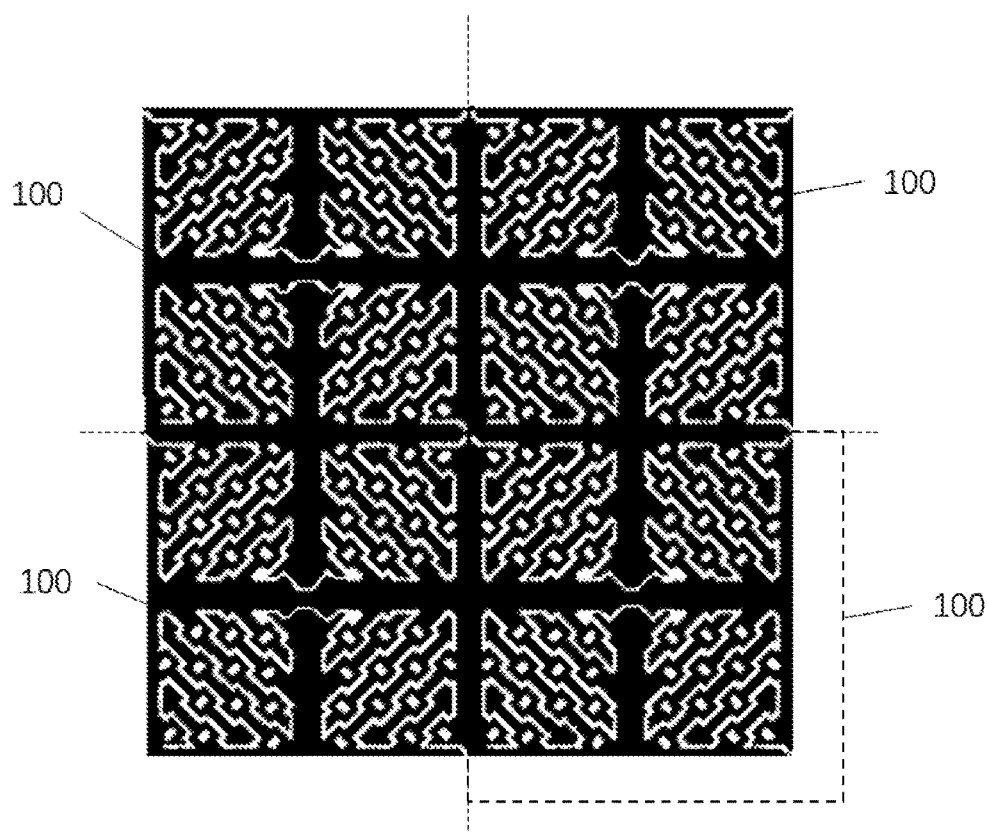
FIG. 1 is a schematic plan view of a touch electrode layer according to one embodiment of the present invention.

Referring to FIG. 1, a touch electrode layer is provided, and the touch electrode comprises a plurality of touch electrode units 100 disposed in an array and electrically connected to each other, and the touch electrode units 100 are connected to a driving chip by wires. The touch electrode unit 100 comprises a first electrode 10 and a second electrode 20 that are insulated from each other.

Figure 2:
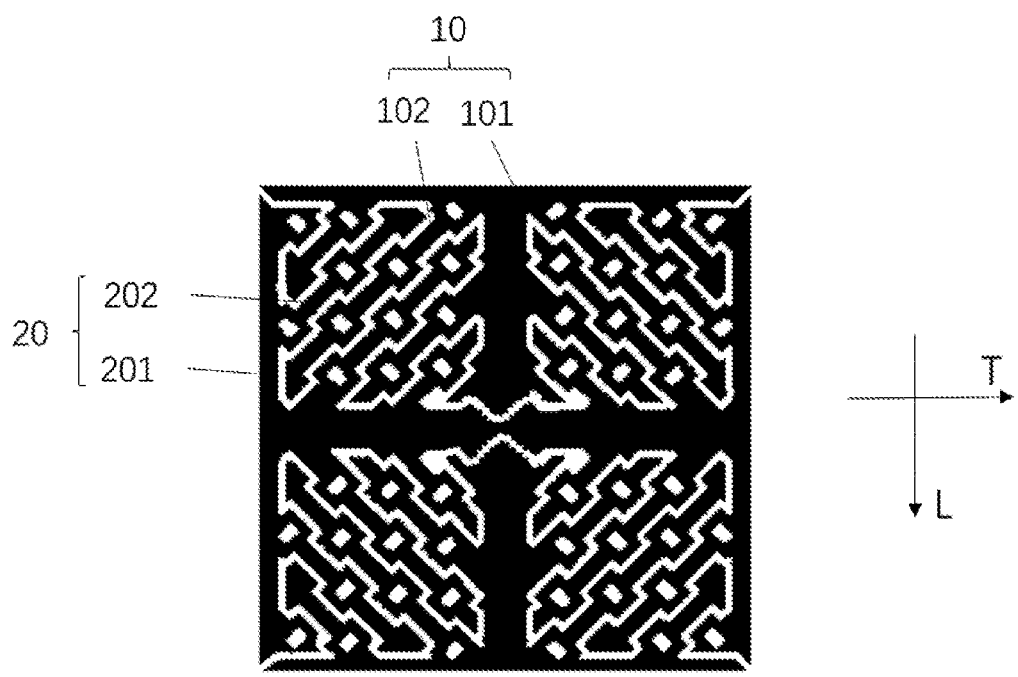
FIG. 2 is a schematic plan view of a touch electrode unit according to one embodiment of the present invention.
Figure 3:
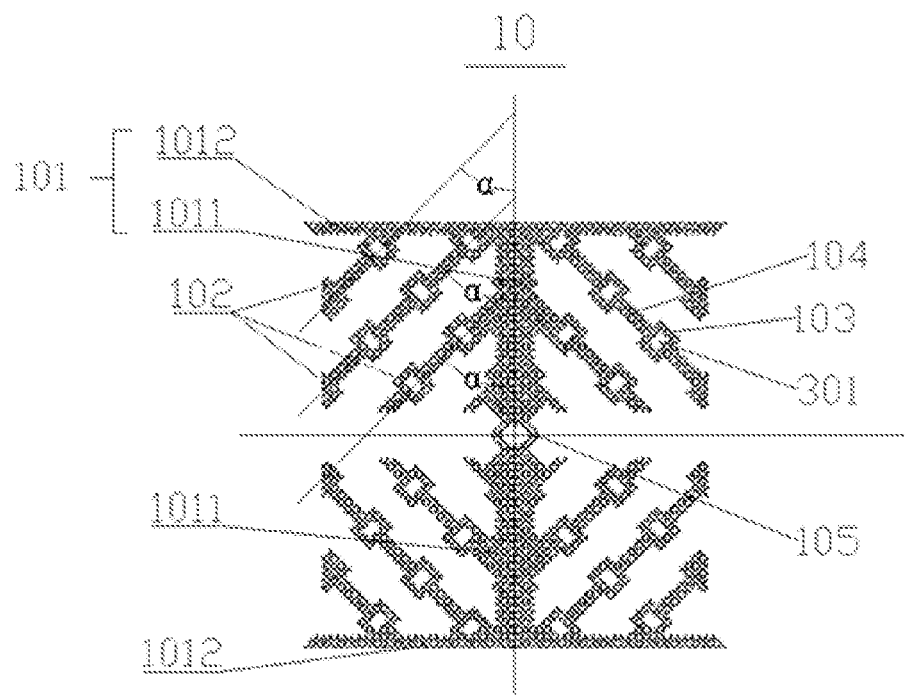
FIG. 3 is a schematic plan view of a first electrode in the touch electrode unit according to one embodiment of the present invention.
Figure 4:
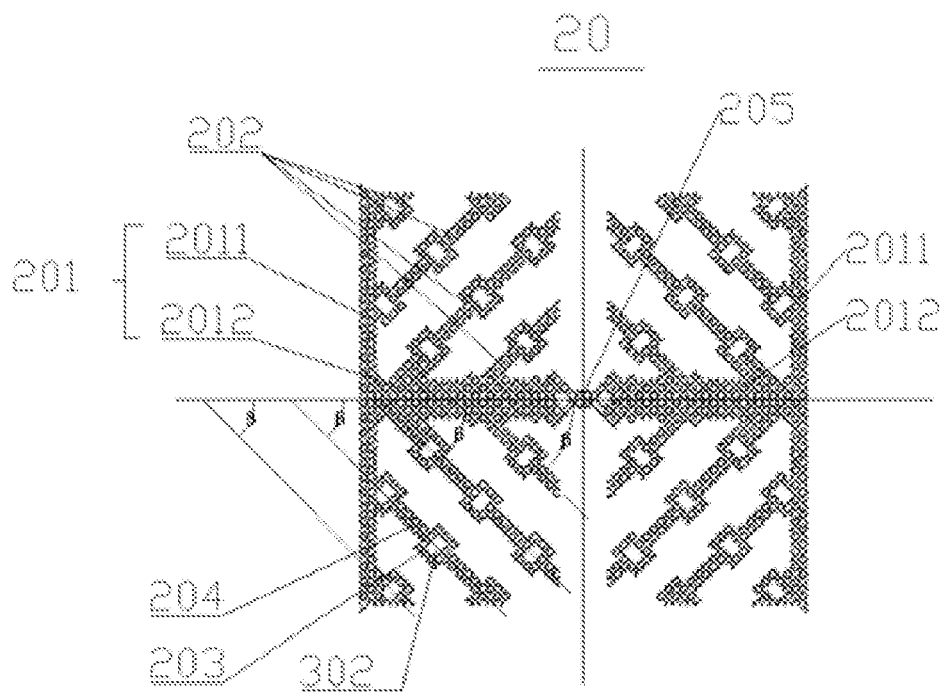
FIG. 4 is a schematic plan view of a second electrode in the touch electrode unit according to one embodiment of the present invention.

Referring to FIG. 2 to FIG. 4, the first electrode 10 in the touch electrode unit 100 comprises a first electrode trunk 101 and a plurality of first electrode branches 102. The first electrode trunk comprises a first electrode longitudinal trunk 1011 extending along the first direction and two first electrode transverse trunks 1012 located at both ends of the first electrode longitudinal trunk 1011 extending along the second direction. The first electrode branch 102 extends away from the first electrode longitudinal trunk 1011 or from the first electrode transverse trunk 1012, and the first electrode branch 102 comprises at least a first branch widening part 103 and a first branch connecting part 104 connected to the first branch widening part 103, and a width of the first branch widening part 103 extending along the perpendicular direction to the first electrode branch is larger than a width of the first branch connecting part 104. In this embodiment, the first branch widening part 103 is disposed at equal intervals along the extension direction of the first electrode branch 102.

A first hollow area is formed in at least one first branch widening part 103, and a first dummy electrode 301 is disposed in the first hollow area. The first dummy electrode 301 and the first electrode 10 are electrically insulated from each other, and the first dummy electrode 301 is not connected to any external circuit wire or effective electrode.

The touch electrode unit 100 in the second electrode 20 comprises a second electrode trunk 201 and a plurality of second electrode branches 202. The second electrode trunk 201 comprises a second electrode transverse trunk 2012 extending along the second direction "T" and a second electrode longitudinal trunk 2011 located at both ends of the second electrode transverse trunk 2012 and extending along the first direction "L". The second electrode branch 202 extends away from the second electrode longitudinal trunk 2011 or the second electrode transverse trunk, and the second electrode branch 202 comprises at least a second branch widening part 203 and a second branch connecting part 204 connected to the second branch widening part 203. A width of the second branch widening part 203 extending along the perpendicular direction to the first electrode branch is greater than a width of the second branch connecting part 204. In one embodiment, the second branch widening part 203 is disposed at equal intervals along the extending direction of the second electrode branch 202.

A second hollow area is formed in at least one second branch widening part 203, and a second dummy electrode 302 is disposed in the second hollow area. The second dummy electrode 302 and the second electrode 20 are electrically insulated from each other, and the second dummy electrode 302 is not connected to any external circuit wire or effective electrode.

The first electrode branch 102 and the second electrode branch 202 are disposed alternately. Preferably, in one embodiment, the first electrode 10 is a driving electrode (Tx), and the second electrode 20 is a sensing electrode (Rx). In other embodiments, the first electrode 10 is a Rx and the second electrode 20 is a Tx.

In one embodiment, the branch electrode is disposed on the electrode trunk, and it is specifically defined that the branch electrode has a widening part with a larger width and a connecting part with a smaller width, and it may help to increase the coupling area between the first electrode and the second electrode. The dummy electrode is disposed between and within the first electrode and the second electrode, and it may effectively reduce the parasitic capacitance of the electrode to the cathode, thereby improving the reporting rate. At the same time, the dummy electrode facilitates the light distribution emitted by the organic light emitting diode display panel passing through the touch layer. In addition, since the impedance of the driving electrode is determined by the impedance of the electrode along the longitudinal axis, therefore no dummy electrode is disposed in the main channels of the first electrode and second electrode, which may minimize the drive electrode impedance.

Figure 5:
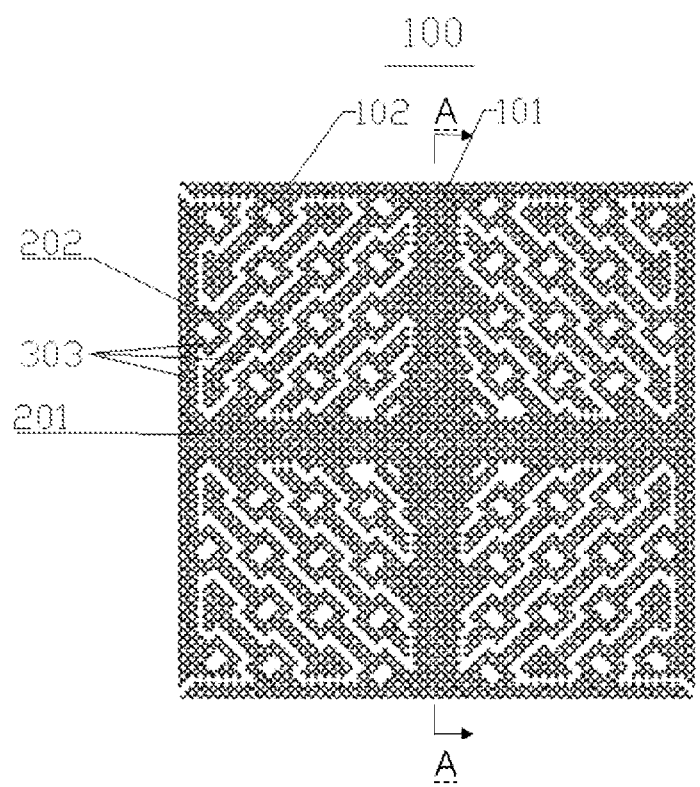
FIG. 5 is a schematic plan view of another structure of a touch electrode unit according to one embodiment of the present invention.

Referring to FIG. 5, in the touch electrode, a third dummy electrode 303 is disposed on a junction between edges of the first electrode 10 and the second electrode 20. The third dummy electrode 303 is electrically insulated from the first electrode 10 and the second electrode 20. The dummy electrode is disposed on a junction between edges of the first electrode and the second electrode, thereby reducing the mutual capacitance between the electrodes, and increasing the ratio of the mutual capacitance change when the screen is touch by finger or not, and improving the signal-to-noise ratio. At the same time, the third dummy electrode helps to isolate the first electrode from the second electrode and third dummy electrode is filled in the isolated area, so to avoid the uneven light emission of pixels due to the absence of metal patterns in the isolated area.

In one embodiment, the first branch widening part 103 of each first electrode branch 102 is correspondingly disposed and adjacent to the second branch connecting part 204 of the second electrode branch 202. The first branch connecting part 104 of each first electrode branch 102 is correspondingly disposed and adjacent to the second branch widening part 203 of the second electrode branch 202. Therefore, the first electrode branch 102 and the second electrode branch 202 may be disposed alternately, which may further increase the coupling area of junction between the first electrode and the second electrode, and it may improve the amount of mutual capacitance signal change $^{\Delta}C_m$, thereby effectively improving the touch sensitivity.

Referring to FIG. 3 and FIG. 4, each the touch electrode unit 100 is divided into four sub-regions by the first electrode longitudinal trunk 1011 and the second electrode transverse trunk 2012, which are disposed alternately. The first electrode branch 102 in each of the sub-region extends from the first electrode trunk to a direction away from the intersection end point between the first electrode longitudinal trunk 1011 and the first electrode transverse trunk 1012. The second electrode branch 202 in each of the sub-region extends from the second electrode trunk to a direction away from the intersection end point between the second electrode transverse trunk 2012 and the second electrode longitudinal trunk 2011.

In one embodiment, an angle α is formed by the first electrode branch 102 and the first electrode longitudinal trunk 1011, and the angle should be 0°<α<90°; and in one embodiment, it is preferable that the angle α formed by the plurality of first electrode branches 102 and the first electrode longitudinal trunk 1011 is the same.

In one embodiment, an angle β is formed by the second electrode branch 202 and the second electrode longitudinal trunk 2011, and the angle should be 0°<β<90°. In one embodiment, it is preferable that the angle β formed by the plurality of second electrode branches 202 and the second electrode longitudinal trunk 2011 is the same.

In one embodiment, the first electrode branch 102 and the second electrode branch 202 are disposed alternately, and each the first electrode branch 102 and the second electrode branch 202 adjacent to the first electrode branch 102 are parallel to each other. In other embodiments, the first direction "L" is perpendicular to the second direction "T", and the first electrode longitudinal trunk disposed along the first direction and the second electrode transverse trunk disposed along the second direction are vertically intersected, and it is preferable that the angle α and the angle β satisfy α=β=45°. In one embodiment, the alternate arrangement of the electrode branches may make mutual capacitance to distribute more evenly.

In one embodiment, in each of the single touch electrode units, the first electrode and the second electrode are mirror-symmetric with respect to the first electrode longitudinal trunk and second electrode transverse trunk.

In one embodiment, the structure of the touch electrode layer may realize that the first electrode branch 102 and the second electrode branch 202 are disposed alternately. At the same time, in the touch electrode unit 100, the shape and size of Tx is almost the same with the shape and size of the Rx, and the shape and size of the branch electrodes disposed in adjacent to each other is almost the same, which may effectively increase the mutual capacitance between the Tx and Rx, and may make more even distribution for the mutual capacitance, thereby improving the resolution and accuracy for detecting the touch position.

It should be noted that the interactive capacitance between the Tx and Rx needs to be maintained within a certain reasonable range, and it should not be too high or too low, as too high will cause a lower capacitance change when touched as compared to the original Tx/Rx change rate of the interactive capacitance; and if it is too low, it may cause the touch capacitance signal itself to be small when the screen is touched.

In one embodiment, the first electrode longitudinal trunk 1011 and the second electrode transverse trunk 2012 are disposed at an intersection position, and the first electrode longitudinal trunk 1011 located at both sides of the second electrode transverse trunk is connected by a first connecting part 105. It is preferable that the first connecting part 105 has a double-bridge structure made of two connecting bridges, and the two connecting bridges are independent and not connected to each other.

In one embodiment, the second electrode transverse trunk 2012 located at both sides of the first electrode longitudinal trunk 1011 is connected by a second connecting part 205, and it is preferable that the second connecting part penetrates the first electrode longitudinal trunk to connect to the second electrode transverse trunk 2012, or the second connecting part is integrated with the second electrode transverse trunk 2012, or the second branch connecting is a part of the second electrode transverse trunk 2012.

Figure 6:
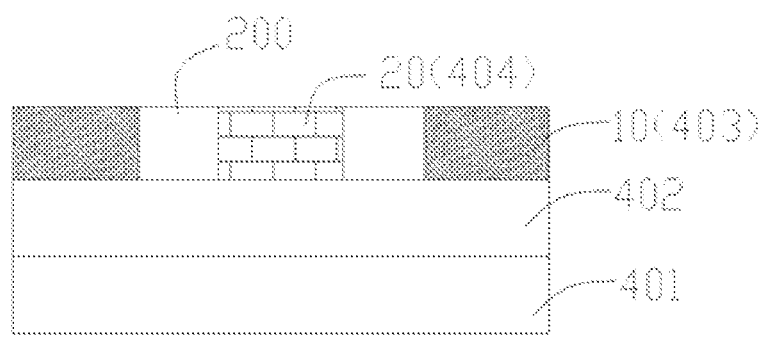
FIG. 6 is a cross-sectional view of the touch electrode unit along the A-A section according to one embodiment of the present invention.

Referring to FIG. 6, the cross-sectional structure of the touch electrode layer comprises a buffer layer 401, an insulating layer 402, a first patterned metal 403 and a second patterned metal 404.

In one embodiment, the insulating layer 402 is disposed on the buffer layer 401. The first electrode 10 is the first patterned metal 403, and the second electrode 20 is the second patterned metal 404. The first patterned metal 403 and the second patterned metal 404 are disposed on the same level layer, and the first patterned metal 403 and the second patterned metal 404 are formed by patterning the same metal layer.

Figure 7:
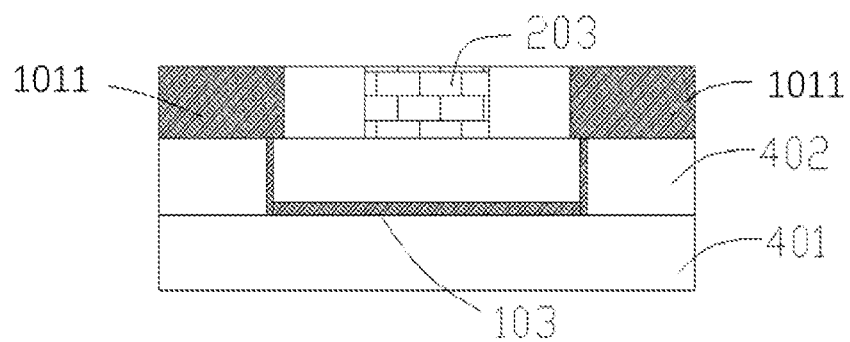
FIG. 7 is a cross-sectional view of the touch electrode unit along the A-A section in the intersection area according to one embodiment of the present invention.

Referring to FIG. 7, in the intersection area formed at the center of the first electrode 10 and the second electrode 20, the first branch connecting part 103 is a connecting bridge, which is disposed in the insulating layer 202 for connecting the first electrode trunk 101 and the first electrode branch 102 of the first electrode 10. The second branch connecting part 203 and the second electrode 20 are disposed on the same level layer, and the first branch connecting part 103 and the second branch connecting part 203 are made of metal wires.

In other embodiment, the first patterned metal 403 and the second patterned metal 404 may be disposed on different layers for avoiding the cross connection of the intersection area. In the intersection area, the first electrode and the second electrode may connect directly without setting up a connecting bridge. Specifically, the first patterned metal 403 is disposed on the insulating layer 402, and the second patterned metal 404 is disposed on the insulating layer 402.

In one embodiment, an entire surface of the first electrode 10 and the second electrode 20 are made of ITO or a metal mesh, and the materials comprise metal such as Ti/Al/Mo/Ag/Cu or alloys of the above-mentioned metal materials.

In an embodiment, the first dummy electrode 301, the second dummy electrode 302, and the third dummy electrode 303 are disposed on the same level layer with the first electrode 10 and the second electrode 20, and preferably are formed with the first electrode 10 and the second electrode 20 after patterning and disposing on the same metal layer, and the dummy electrode is disconnected from the first electrode and the second electrode via a gap, so that the dummy electrode is not electrically connected to an external metal circuit and an effective electrode.

In one embodiment, the design of the patterned touch electrode may ensure the signal amount is greater than or equal to 60 fF when the screen is touched by finger, and it avoids the unsaturation charging of the touch electrode caused by the excessive large RC delay of the touch display, which causes a drop in sensing frequency and affects the touch performance indicators such as the reporting rate.

In one embodiment, the outer shapes of the first branch widening part 103 and the second branch widening part 203 are square, and the interior hollow area is also a square. In other embodiments, the widening area and the hollow area may also be set in a curved structure such as a circle or an ellipse.

Figure 8:
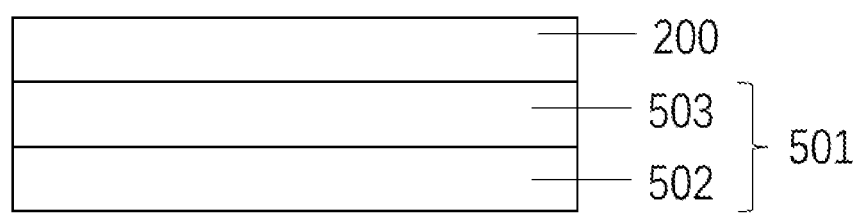
FIG. 8 is a schematic structural diagram of a touch display device according to one embodiment of the present invention.

Referring to FIG. 8, a touch display device 500 is provided, and the touch display device 500 comprises a touch electrode layer 200 and an organic light emitting diode display panel 501. The organic light emitting diode display panel 501 comprises an organic light emitting diode array layer 502 and a thin film packaging layer 503, and the thin film packaging layer 503 is disposed between the organic light emitting diode array layer 502 and the touch electrode layer 200.

Figure 9:
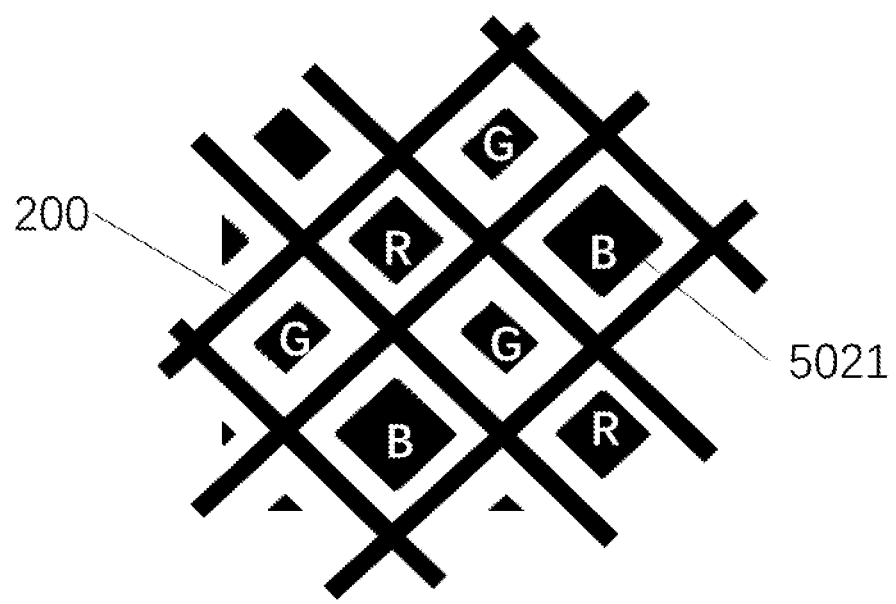
FIG. 9 is a schematic diagram of a metal mesh structure of the touch electrode layer according to one embodiment of the present invention.

Referring to FIG. 9, the organic light emitting diode array layer 502 comprises a plurality of sub-pixels 5021, and the touch electrode layer 200 is made of a metal mesh, and the metal mesh is disposed along the spacing area between two adjacent sub-pixels 5021, and an orthographic projection of the first electrode branch on the organic light emitting diode array layer is surrounded by at least two sub-pixels in a width direction of the first electrode branch, and an orthographic projection of the second electrode branch on the organic light emitting diode array layer is surrounded by at least two sub-pixels in a width direction of the second electrode branch. It may effectively ensure the interactive capacitance between the first electrode and the second electrode, and the proportion of the interactive capacitance caused by touching the touch screen.

In the above, the present invention has been described in the above preferred embodiments, but the preferred embodiments are not intended to limit the scope of the invention, and a person skilled in the art may make various modifications without departing from the spirit and scope of the invention. The scope of the present invention is determined by claims.

What is claimed is:

1. A touch electrode layer, comprising a plurality of touch electrode units disposed in an array and electrically connected to each other, wherein each of the touch electrode units comprises:

a first electrode disposed along a first direction, wherein the first electrode comprises a first electrode trunk and a plurality of first electrode branches, and the plurality of first electrode branches are electrically connected to the first electrode trunk, and each of the first electrode branches comprises at least one first branch widening part and a first branch connecting part connected to the a first branch widening part, and a width of the first branch widening part is greater than a width of the first branch connecting part; and a second electrode disposed along a second direction, wherein the second electrode comprises a second electrode trunk and a plurality of second electrode branches, and the plurality of second electrode branches are electrically connected to the second electrode trunk, and each of the second electrode branches comprises at least one second branch widening part and a second branch connecting part connected to the a second branch widening part, and a width of the second branch widening part is greater than a width of the second branch connecting part, and the first direction is different from the second direction;

wherein the first electrode branches and the second electrode branches are disposed alternately, and a first hollow area is formed in the at least one first branch widening part of the first electrode, and a first dummy electrode is disposed in the first hollow area;

wherein a second hollow area is formed in the at least one second branch widening part of the second electrode, and a second dummy electrode is disposed in the second hollow area; and wherein the first dummy electrode, the second dummy electrode, the first electrode, and the second electrode are electrically insulated from each other.

2. The touch electrode layer according to claim 1, wherein a third dummy electrode is disposed on a junction between edges of the first electrode and the second electrode, and the third dummy electrode, the first electrode, and the second electrode are electrically insulated from each other.

3. The touch electrode layer according to claim 1, wherein each the first branch widening part of the first electrode branch is disposed corresponding to the second branch connecting part of the second electrode branch adjacent to the first electrode branch; and wherein each the first branch connecting part of the first electrode branch is disposed correspondingly to the a second branch widening part of the second electrode branch adjacent to the first electrode branch.

4. The touch electrode layer according to claim 1, wherein the first electrode trunk comprises a first electrode longitudinal trunk extending along the first direction and two first electrode transverse trunks located at both ends of the first electrode longitudinal trunk and extending along the second direction, and the first electrode longitudinal trunk and the first electrode transverse trunk are electrically connected to the first electrode branch; and wherein the second electrode trunk comprises a second electrode transverse trunk extending along the second direction and two second electrode longitudinal trunks located at both ends of the second electrode transverse trunk and extending along the first direction, and the second electrode longitudinal trunk and the second electrode transverse trunk are electrically connected to the second electrode branch.

5. The touch electrode layer according to claim 4, wherein the first electrode branch from the first electrode trunk extends away from an intersection point of the first electrode longitudinal trunk and the first electrode transverse trunk, and an angle α between the first electrode branch and the first electrode longitudinal trunk satisfies 0°<α<90°; and wherein the second electrode branch from the second electrode trunk extends away from an intersection point of the second electrode longitudinal trunk and the second electrode transverse trunk, and an angle β between the second electrode branch and the second electrode longitudinal trunk satisfies 0°<β<90°.

6. The touch electrode layer according to claim 5, wherein the first electrode branch and the second electrode branch adjacent to the first electrode branch are parallel to each other.

7. The touch electrode layer according to claim 5, wherein the first direction is perpendicular to the second direction, and the angle α between the first electrode branch and the first electrode longitudinal trunk is 45°, and the angle β between the second electrode branch and the second electrode transverse trunk is 45°.

8. The touch electrode layer according to claim 7, wherein the first electrode and the second electrode are mirror-symmetric with respect to the first electrode longitudinal trunk and the second electrode transverse trunk.

9. The touch electrode layer according to claim 4, wherein two first electrode longitudinal trunks located on both sides of the second electrode transverse trunk are connected by a first connecting part;

wherein two second electrode transverse trunks located on both sides of the first electrode longitudinal trunk are connected by a second connecting part; and wherein the first connecting part is made of two connecting bridges that are not connected to each other.

10. A touch display device, comprising:
a touch electrode layer; and
an organic light emitting diode display panel;
wherein the touch electrode layer is disposed on the organic light emitting diode display panel comprising an organic light emitting diode array layer and a thin film packaging layer, and the thin film packaging layer is disposed between the organic light emitting diode array layer and the touch electrode layer;
wherein touch electrode layer comprises a plurality of touch electrode units disposed in an array and electrically connected with each other, and each of the touch electrode units comprises:
a first electrode disposed along a first direction, wherein the first electrode comprises a first electrode trunk and a plurality of first electrode branches, and the plurality of first electrode branches are electrically connected to the first electrode trunk, and each of the first electrode branches comprises at least one first branch widening part and a first branch connecting part connected to the a first branch widening part, and a width of the first branch widening part is greater than a width of the first branch connecting part; and
a second electrode disposed along a second direction, wherein the second electrode comprises a second electrode trunk and a plurality of second electrode branches, and the plurality of second electrode branches are electrically connected to the second electrode trunk, and each of the second electrode branches comprises at least a second branch widening part and a second branch connecting part connected to the a second branch widening part, and a width of the second branch widening part is greater than a width of the second branch connecting part, and the first direction is different from the second direction;

wherein each of the first electrode branch and the second electrode branch are disposed alternately, and a first hollow area is formed in the at least one first branch widening part of the first electrode, and a first dummy electrode is disposed in the first hollow area;

wherein a second hollow area is formed in the at least one second branch widening part of the second electrode, and a second dummy electrode is disposed in the second hollow area; and wherein the first dummy electrode, the second dummy electrode, the first electrode, and the second electrode are electrically insulated from each other.

11. The touch display device according to claim 10, wherein a third dummy electrode is disposed on a junction between edges of the first electrode and the second electrode, and the third dummy electrode, the first electrode, and the second electrode are electrically insulated from each other.

12. The touch display device according to claim 10, wherein each the first branch widening part of the first electrode branch is disposed corresponding to the second branch connecting part of the second electrode branch adjacent to the first electrode branch; and wherein each the first branch connecting part of the first electrode branch is disposed corresponding to the a second branch wodening part of the second electrode branch adjacent to the first electrode branch.

13. The touch display device according to claim 10, wherein the first electrode trunk comprises a first electrode longitudinal trunk extending along the first direction and two first electrode transverse trunks located at both ends of the first electrode longitudinal trunk and extending along the second direction, and the first electrode longitudinal trunk and the first electrode transverse trunk are electrically connected to the first electrode branch; and wherein the second electrode trunk comprises a second electrode transverse trunk extending along the second direction and two second electrode longitudinal trunks located at both ends of the second electrode transverse trunk extending along the first direction, and the second electrode longitudinal trunk and the second electrode transverse trunk are electrically connected to the second electrode branch.

14. The touch display device according to claim 13, wherein the first electrode branch from the first electrode trunk extends away from an intersection point of the first electrode longitudinal trunk and the first electrode transverse trunk, and an angle α between the first electrode branch and the first electrode longitudinal trunk satisfies 0°<α<90°; and wherein the second electrode branch from the second electrode trunk extends away from an intersection point of the second electrode longitudinal trunk and the second electrode transverse trunk, and an angle β between the second electrode branch and the second electrode longitudinal trunk satisfies 0°<β<90°.

15. The touch display device according to claim 14, wherein the first electrode branch and the second electrode branch adjacent to the first electrode branch are parallel to each other.

16. The touch display device according to claim 14, wherein the first direction is perpendicular to the second direction, and the angle α between the first electrode branch and the first electrode longitudinal trunk is 45°, and the angle β between the second electrode branch and the second electrode transverse trunk is 45°.

17. The touch display device according to claim 16, wherein the first electrode and the second electrode are mirror-symmetric with respect to the first electrode longitudinal trunk and the second electrode transverse trunk.

18. The touch display device according to claim 13, wherein two first electrode longitudinal trunks located on both sides of the second electrode transverse trunk are connected by a first connecting part;

wherein two second electrode transverse trunks located on both sides of the first electrode longitudinal trunk are connected by a second connecting part; and wherein the first connecting part is made of two connecting bridges that are not connected to each other.

19. The touch display device according to claim 10, wherein the organic light emitting diode array layer comprises a plurality of sub-pixels, and the first electrode branch and the second electrode branch are made of the metal mesh;

wherein an orthographic projection of the first electrode branch on the organic light emitting diode array layer is surrounded by at least two sub-pixels in a width direction of the first electrode branch; and wherein an orthographic projection of the second electrode branch on the organic light emitting diode array layer is surrounded by at least two sub-pixels in a width direction of the second electrode branch.

\* \* \* \* \*